United States Patent
Carlson et al.

(10) Patent No.: US 9,093,955 B2
(45) Date of Patent: Jul. 28, 2015

(54) ASYNCHRONOUS TIME-INTERLEAVED WAVEFORM GENERATOR USING HARMONIC MIXING

(71) Applicant: Tektronix, Inc., Beaverton, OR (US)

(72) Inventors: John E. Carlson, Beaverton, OR (US); Joan Mercade, Barcelona (ES)

(73) Assignee: TEKTRONIX, INC., Beaverton, OR (US)

( * ) Notice: Subject to any disclaimer, the term of this patent is extended or adjusted under 35 U.S.C. 154(b) by 0 days.

(21) Appl. No.: 14/220,860

(22) Filed: Mar. 20, 2014

(65) Prior Publication Data

US 2014/0285251 A1    Sep. 25, 2014
US 2015/0077169 A2    Mar. 19, 2015

Related U.S. Application Data

(60) Provisional application No. 61/803,970, filed on Mar. 21, 2013.

(51) Int. Cl.
| | |
|---|---|
| *H03K 3/00* | (2006.01) |
| *H03D 7/14* | (2006.01) |
| *H03M 1/08* | (2006.01) |
| *H03M 1/66* | (2006.01) |

(52) U.S. Cl.
CPC ............... *H03D 7/1408* (2013.01); *H03M 1/08* (2013.01); *H03M 1/662* (2013.01)

(58) Field of Classification Search
CPC ............... G06F 1/04; G06F 1/06; G06F 1/08; G06F 1/10

USPC .................................................. 327/291–299
See application file for complete search history.

(56) References Cited

U.S. PATENT DOCUMENTS

| | | |
|---|---|---|
| 2005/0258992 A1 | 11/2005 | Fontaine et al. |
| 2011/0227665 A1* | 9/2011 | Wyville ....................... 333/17.1 |
| 2012/0299579 A1 | 11/2012 | Knierim |

OTHER PUBLICATIONS

Klumperink, Eric et al., "Cognitive Radios for Dynamic Spectrum Access-Polyphase Multipath Radio Circuits for Dynamic Spectrum Access", IEEE Communications Magazine, IEEE Service Center, vol. 44, No. 5, May 1, 2007, pp. 104-112, XP011181064.
European Search Report and Written Opinion for Application No. 14161187.1, dated Dec. 12, 2014, 9 pages.

* cited by examiner

*Primary Examiner* — Sibin Chen
(74) *Attorney, Agent, or Firm* — Marger Johnson & McCollom, P.C.; Michael A. Nelson

(57) ABSTRACT

Waveforms generators include a splitter that splits a digital input signal into a number of split signals each having a split signal frequency bandwidth that is substantially similar to a digital input signal frequency bandwidth. The split signals are mixed with associated digital, harmonic signals to generate a number of digital, mixed signals, which are then converted to analog signals at an effective sample rate that is different from a first order harmonic signal of at least one of the digital, harmonic mixers. A number of analog, harmonic mixers mix the associated analog signals with associated analog, harmonic signals to generate mixed, analog signals. The mixed, analog signals are combined into an output signal having an output signal bandwidth that is greater than a bandwidth of at least one of the number of DACs.

17 Claims, 9 Drawing Sheets

ASYNCHRONOUS TIME-INTERLEAVED WAVEFORM GENERATOR USING HARMONIC MIXING

CROSS REFERENCE TO RELATED APPLICATION

This application claims the benefit of U.S. Provisional Patent Application No. 61/803,970, filed Mar. 21, 2013, which is incorporated herein in its entirety.

FIELD OF THE INVENTION

This disclosure relates to waveform generators and methods of generating waveforms. More specifically, this disclosure relates to high speed arbitrary waveform or function generators using harmonic mixing.

BACKGROUND

Usable bandwidths of waveform generators, such as Arbitrary Waveform Generators (AWGs) or Arbitrary Function Generators (AFGs), can be limited by a digital to analog converter (DAC) that is used to generate the signal from a digital waveform sequence. The usable bandwidth of a DAC is limited by the lesser of the analog bandwidth or one half the maximum sample rate of the DAC. Conventional techniques for generating higher bandwidth output signals with existing DAC limitations can be complex and expensive systems.

For example, synchronous time interleaving can be used to achieve an effective higher DAC sample rate. Multiple DACs generate waveforms from a split input sequence that is offset in time within a single DAC sample period. The analog signals are combined for a sample rate that is effectively multiplied. However, in the examples in which the analog bandwidth of the DACs becomes the limiting factor, a high bandwidth active combiner, such as an analog multiplexer or sample and hold multiplexer, is needed to achieve the higher bandwidth.

Conventional multiplexed time interleaved systems cause the multiplexer to be clocked at a sample rate similar to the DAC channel bandwidth so that the DAC has sufficient time to transition and settle during the multiplexer clock interval. The DACs are synchronously clocked to the multiplexer, in these conventional systems, so that each DAC sample is gated and then selected by the multiplexer. Such a limitation of the DAC bandwidth limits the DAC sample rate and, in turn, limits the multiplexer clock rate. As a result, these conventional systems need many DAC channels to achieve the desired performance.

As the number of DAC channels increases, the overall cost and complexity of the system correspondingly increases. For instance, each DAC requires a separate memory and digital input path, as well as clocking and a method of synchronizing all DAC channels, which requires a physically large and complex multiplexing chip. The increased size and complexity of the multiplexing chip also results in longer communication paths, and therefore, an increase in parasitic capacitance, inductance, electromagnetic noise, and design difficulties, among other challenges.

In another technique, sub-bands of an input signal are digitally downconverted to a frequency range that can be passed through a lower sample rate DAC. The large input signal bandwidth is split into multiple low bandwidth DAC channels. After being converted to analog signals at the low bandwidth of the DACs, the sub-bands are digitally upconverted to the respective original frequency ranges and combined into a representation of the digital input signal. However, when converting an arbitrary input signal having a frequency content that is routed through a single DAC channel, the recombined output contains inherent noise because it has signal energy from only one DAC channel and a noise energy from all DAC channels, which degrades the overall signal-to-noise (SNR) ratio of the system.

Accordingly, the art would benefit from waveform generating devices and methods having an improved SNR.

DETAILED DESCRIPTION

This disclosure describes embodiments of a DAC system for waveform generators that increases the sample rate and usable bandwidth of the analog output signal by using harmonic mixing.

Figure 1:
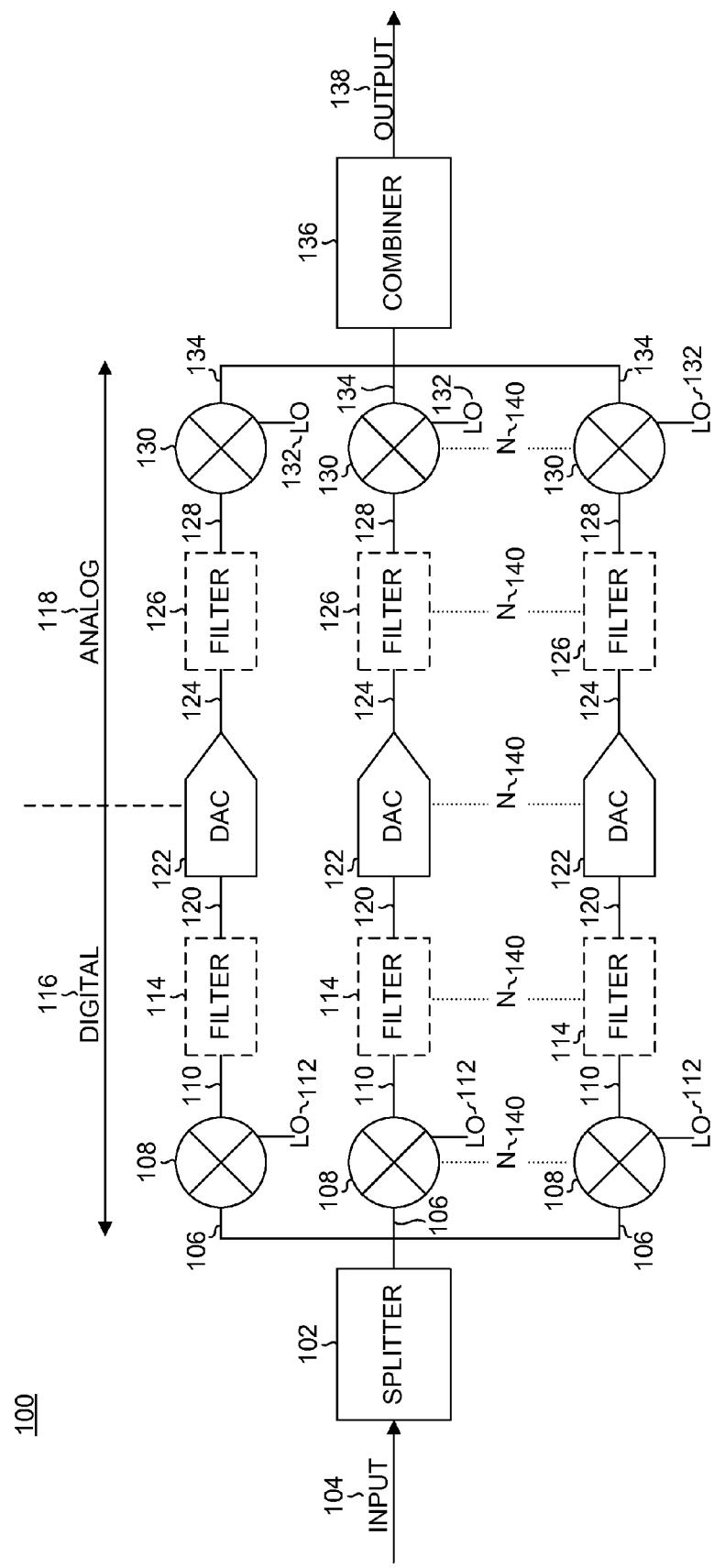
FIG. 1 is a block diagram of an example waveform generator that uses harmonic mixing, according to embodiments of the invention.

FIG. 1 is a block diagram of an example waveform generator 100 that uses harmonic mixing and, various filters, some of which may be optional in various examples. The waveform generator 100 includes a splitter 102 that is structured to receive a digital input signal 104. The splitter 102 is structured to split the digital input signal 104 into a plurality of split signals 106. The digital input signal 104 can be any suitable waveform data sequence.

Each of the split signals 106 has a split signal frequency bandwidth that is substantially similar to the input signal frequency bandwidth. The splitter 102 can be any variety of circuitry that can split the digital input signal 104 into multiple signals. For example, the split signals 106 can include any desired digital input stream having a given sample rate and includes recorded, stored, and/or generated data sequences.

The split signals 106 are input to digital, harmonic mixers 108 that are structured to digitally mix its associated split signal 106 with an associated digital, harmonic signal to generate a digital, mixed signal 110. Each of the digital, harmonic mixers produces a digital, mixed signal. The digital harmonic signal can include a local oscillator (LO) 112 that applies the harmonic signals to the split signals, as shown in FIG. 1. The digital LO can be a numerically-controlled oscillator, in some example systems.

The digital, harmonic mixers 108 are any device that is configured to mix a signal with multiple harmonics. Although multiplication and/or mixing has been described in connection with harmonic mixing, as will be described in greater detail below, any device that has the effect of multiplying a signal with multiple harmonics can be used as a harmonic mixer.

In some examples, the multiple harmonics can include a zero-order harmonic, or a DC component. For example, the harmonic signal can be a signal represented by equation (1):

$$\text{harmonic signal} = 1 + 2*\cos(2\pi*F_1*t) \qquad (1)$$

In equation (1), $F_1$ represents the first-order harmonic and t represents time. Thus, a signal having the form of equation (1) has harmonics at DC and at frequency $F_1$.

An inverted phase signal harmonic can be a signal represented by equation (2):

$$\text{inverted harmonic signal} = 1 - 2*\cos(2\pi*F_1*t) \qquad (2)$$

Similar to the harmonic signal represented by equation (1), the inverted harmonic signal has harmonics at DC and frequency $F_1$. However, the first-order harmonic at frequency $F_1$ is out of phase by 180 degrees relative to the similar first-order harmonic in the harmonic signal represented by equation (1).

Referring again to FIG. 1, the mixed, digital signals 110 are input to filters 114. The mixed, digital signals 110 can have a sample rate that is greater than the maximum effective sample rate of the DACs 122 and can include a frequency bandwidth that is greater than one half the effective sample rate of the DACs 122. The filter 114 can limit the bandwidth of the mixed, digital signals to prevent aliasing signal distortion. The filter can include a symmetric Low Pass Filter (LPF) that generates a net filtering of the mixed signals that has a frequency response that is substantially complementary to about one half of a frequency of the first-order harmonic of the harmonic signals. The frequency response at a given offset higher than $F_1/2$ and the frequency response at a given offset lower than frequency $F_1/2$ can add to one. Although one has been used as an example, other values can be used as desired, such as for scaling of signals. Further, the above example is described as an ideal case. The implemented filtering can have a different response to account for non-ideal components, calibration, and the like.

The symmetric filter is shown in the digital domain 116 of the waveform generator shown in FIG. 1, but can, additionally or alternatively, be included in the analog domain 118 in other examples. The filtered, mixed digital signals 120 are input to associated Digital to Analog Converters 122 (DACs). The sample rate of the filtered, mixed digital signals 120 is downsampled to match the sample rate of the DACs, which can be combined with the filters 114, in some examples. The downsampling can occur by decimating the output sequence of the filtered, mixed digital signals 120, such as by keeping a fewer number of samples of the output sequence.

Any of the above-described splitting, filtering, mixing, and/or downsampling can be implemented by any suitable digital circuitry including, but not limited to, a digital signal processor (DSP), a microprocessor, a programmable logic device, general purpose processor, or other processing system with appropriate peripheral devices, as desired, including complete integration to fully discrete components.

Each of the DACs 122 are structured to convert the filtered, mixed, digital signals 120 into analog signals 124. The DACs 122 are any variety of circuitry that is configured to convert a digital signal to an analog signal. Each DAC 122 can include an amplifier, filter, attenuator, and other digital or analog circuitry, as needed, to amplify, filter, attenuate or otherwise process the signal before or after the digital signal is converted to an analog signal.

The DACs 122 are configured to operate at an effective sample rate. In the example waveform generator shown in FIG. 1, DACs 122 are shown as a single DAC, but in other examples each DAC may include multiple, interleaved DACs operating at a lower sample rate to achieve a higher effective sample rate.

The effective sample rate of the DAC 122 (or the multiple, interleaved DACs) is different from a first order harmonic signal of at least one of the associated digital harmonic mixers 108. A first-order harmonic of at least one of the digital, harmonic signals is different from an effective sample rate of at least one of the DACs 122. For example, the first-order harmonic $F_1$ of the harmonic signal could be 20 GHz and a sample rate of the DAC 122 could be 25 GS/s. Thus, the first-order harmonic $F_1$ is different from the effective sample rate of the DAC 122.

In some examples, the first-order harmonic of a digital, harmonic signal need not be an integer multiple or sub-multiple of the effective sample rate of the DACs 122. The first-order harmonic of a harmonic signal that is associated with the digital, harmonic mixers 108 is not an integer multiple or sub-multiple of the effective sample rate of the DACs 122.

In some examples, the first-order harmonic of a harmonic signal can be between the effective sample rate of the DAC 122 and one half of the effective sample rate of the DAC 122. Such a frequency of the first-order harmonic allows for higher frequency components above and/or below the first-order harmonic to be downconverted in frequency to be below one half of the sample rate of the DAC 122. Thus, such frequency components can be effectively converted to an analog signal 124 by DACs 122. Each of the bands of the split input signal goes through all paths. When more than one channel is combined for processing a single input signal, each channel or path receives substantially the entire bandwidth of the digital input signal. As the digital input signal is transmitted through all of the DACs, the SNR is improved.

The analog signals 124 are input to optional filters, such as the reconstruction filters 126 shown in the example waveform generator 100 of FIG. 1. The reconstruction filters 126 are structured to filter the analog signals 124 from the DACs 122 and substantially eliminate the DAC image frequency components in signals 124. The reconstruction filters could be part of the DACs and/or the mixers, in some alternative examples.

The filtered analog signals 128 are input to a number of associated harmonic, analog mixers 130. There is one mixer 130 for each of the split signal channels. The harmonic, analog mixers 130 are structured to mix an associated one of the filtered, analog signals 128 with an analog, harmonic signal to generate a number of mixed, analog signals 134.

In some examples, the analog, harmonic signals are substantially similar in frequency and phase to the corresponding digital, harmonic signals. The harmonic, analog mixers' harmonic signal can include a local oscillator (LO) 132 that applies the harmonic signals to the filtered analog signal 128. The LO 132 of the analog, harmonic signal can be synchronized with the LO 112 of the digital harmonic signal, as described in greater detail below.

The scaling factors for the digital, harmonic signals and the analog, harmonic signals can be the same or similar to each other even though they are respectively digital and analog signals. The output signals from the analog, harmonic mixers are referred to as remixed signals 134.

The remixed signals 134 are input to a single combiner 136 that is structured to combine the number of remixed (or mixed), analog signals 134 into an output signal 138 having an output signal bandwidth that is greater than a bandwidth of at least one of the number of digital to analog converters. The analog, output signal 138 from the combiner 136 is a reconstruction of the digital input signal 104 that is applied to the splitter 102.

Some form of synchronization of the harmonic signals 112, 132 is used. For example, the harmonics of the analog harmonic signals can be locked to a clock related to the DAC. A frequency of the digital and analog mixers can be a harmonic of a lower-speed clock that is present in the DAC channels in the analog form, but is also correlated to the digital data stream. In other examples, the digital harmonic signal or related signal is also converted by a DAC and is available in the analog domain to synchronize with the analog, LO signal. In still another example, out-of-band tones can be added to one or more of the mixed, digital signals. Using a first-order harmonic of 20 GHz, 11.25 GHz, or 9/16 of 20 GHz, can be added to the mixed, digital signal. Since the added tones can be set to be outside of the bandwidth that is established by the optional digital filter(s), approximately 9 GHz depending on the transition band, the tones can have a substantially negligible effect on the reconstructed signal that is output from the combiner. The tones, however, can be less than a Nyquist frequency, i.e., less than 12.5 GHz for a 25 GS/s sample rate, which means that the tones can be acquired by using the analog, mixed signal before it is filtered. Regardless of the synchronization technique used, a phase and frequency relationship between the digital, harmonic signals and the analog, harmonic signals is maintained.

Figure 2:
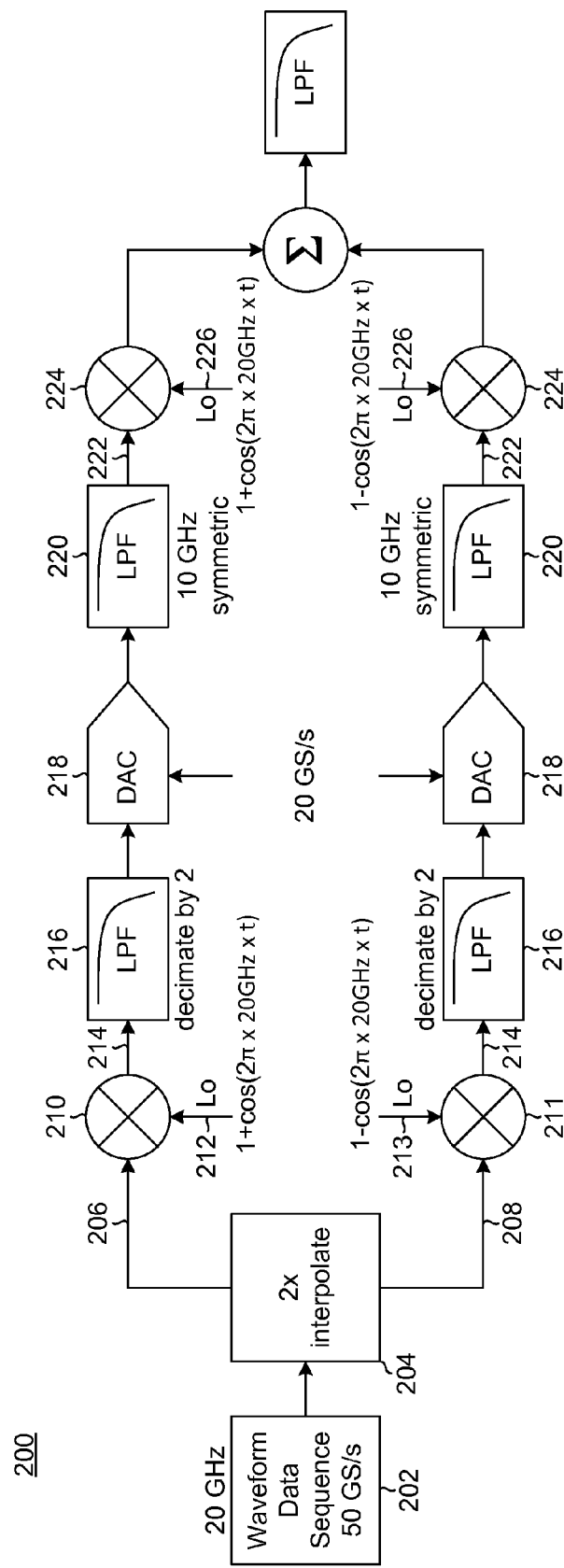
FIG. 2 is a block diagram of another example waveform generator that uses harmonic mixing, according to embodiments.

FIG. 2 is an example of a waveform generator 200 having an input signal 202 that is split by a splitter 204 into two DAC channels 206, 208. The example shown in FIG. 2 includes specific, example values for various components and for the signal frequency, sample rates, etc. The digital input signal 202 is an arbitrary waveform sequence having a sample rate of 50 GS/s. The digital input signal 202 is band-limited to 18 GHz to prevent mixing components from the various harmonic signals from extending past adjacent harmonic frequencies. The sequence is replicated and each path is interpolated to 2× the sample rate of the digital input signal or 100 GS/s by the splitter 204.

The replicated signal is then digitally mixed by digital mixers 210, 211 with the zero'th and first harmonics of a 20.3125 GHz clock 212, 213, using an inverted (180 degree phase-shifted) clock between the two paths 206, 208. The mixed, digital signals 214 are then symmetrically low pass filtered 216 and decimated to a sample rate of 25 GS/s, which is the sample rate at the input of each associated DAC 218. The digital harmonic mixing and the filtering step can be combined with a decimating filter, if desired. The DAC outputs are again filtered with a reconstruction filter 220 to remove the image signal produced by the DAC itself and to have a net response from the analog mixer output that is symmetric in amplitude around a frequency of 10.15625 GHz (i.e., half the harmonic signal bandwidth).

The filtered, analog signals 222 are then mixed by an analog mixer 224 in the analog domain with the same zero'th and first harmonics of the 20.3125 GHz digital clock 212, again using an inverted (180 degree phase-shifted) clock between the two paths. The two paths are summed at the combiner and filtered to remove content above 20.3125 GHz.

In the example arbitrary waveform generator 200 shown in FIG. 2, the LOs 212, 213 of the digital, harmonic mixers 210, 211 and the LO 226 of the analog, harmonic mixers 224 can use the $13^{th}$ harmonic of a divided sample clock. (25 GHz/16=1.5625 GHz, 13*1.5625=20.3125 GHz).

Figure 3A:
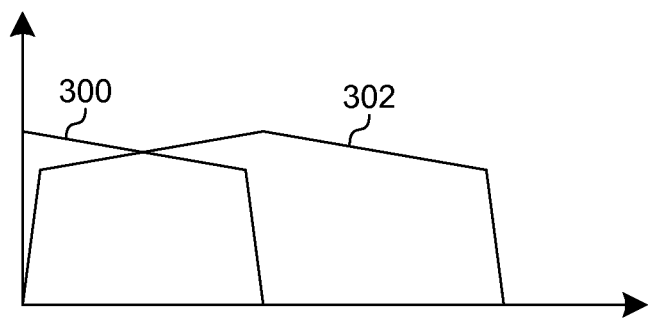
FIGS. 3A, 3B, 4A, 4B, 5A, 5B, and 6 are example spectral components of various signals generated by the example waveform generator shown in FIG. 1.

FIGS. 3A-6 are examples of spectral components of various signals in the waveform generator system shown in FIG. 2. FIG. 3A shows spectrum 300 as a spectrum of the digital input signal and hence, the split signal of FIG. 2. Using the above example of the harmonic signal defined in equation (1), a DC component of the harmonic mixer passes the split signal, as represented by spectrum 300. However, the spectrum 300 in the input signal is also mixed with the first-order harmonic at frequency $F_1$. The resulting spectrum 302 is the product of such mixing. Thus, the digital mixed signal includes components of spectrum 300 and spectrum 302. Here, and in other figures, the spectral components are illustrated as separate and overlapping, however, the actual spectrum would be the combination of the spectra 300 and 302.

Figure 3B:
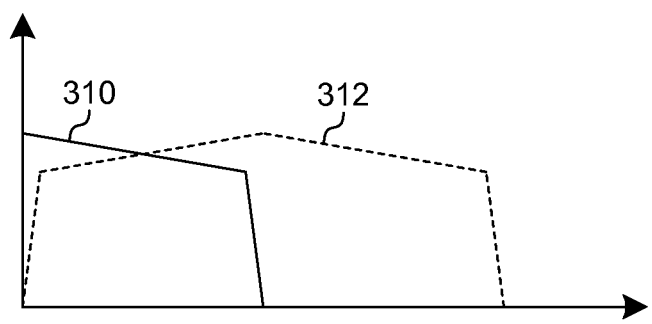

Referring to FIG. 3B, spectrum 310 similarly represents components of the inverted digital mixed signal due to the mixing of the digital input signal with the DC harmonic of the inverted LO signal of the digital harmonic mixer. The spectrum 312 similarly represents the mixed product of the inverted LO and the spectrum 310. As described above, the first-order harmonic of the inverted LO signal of the digital harmonic mixer is phase shifted by 180 degrees from the first-order harmonic of LO signal 212. The 180 degree phase shift in the inverted digital harmonic signal induces a 180 degree phase shift in the spectrum 312. The 180 degree phase difference is illustrated as a dashed line in FIG. 3B.

Figure 4A:
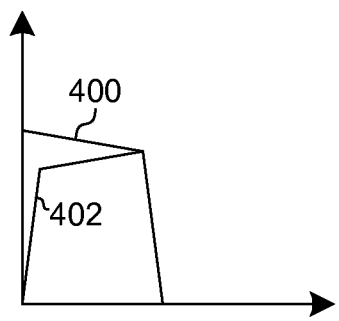
Figure 4B:
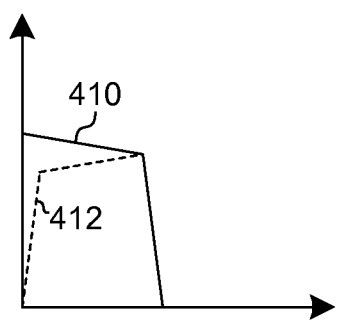

FIGS. 4A and 4B represent the spectrums of the filtered digital mixed signals. Filtering can occur, in this example, in the digital and/or analog domain of the disclosed waveform generator systems and methods. For example, the digital mixed signals could be filtered with a digital symmetric LPF having a cutoff frequency near one half of the effective sample rate of the DACs. In some examples, the filtering can be a function of inherent filtering of the corresponding DACs, the digital filters, or the like.

In some examples, the net filtering of the digital mixed signals can result in a frequency response that is substantially complementary to about one half of a frequency of the first-order harmonic of the LO signals of the digital mixers. The frequency response at a given offset that is higher than frequency $F_1/2$ and the frequency response at a given offset lower than frequency $F_1/2$ can add to one. Although one is used in this example, other values can be used, as desired, such as for scaling of signals. Further, the above example is described as an ideal case and additional filtering can be used to account for non-ideal components, calibration, etc. In an example system, a decimation filter, symmetric filter, and calibration filter are also used to compensate for non-ideal responses in the analog domain.

In a particular example of the frequency response, using the 20.3125 GHz $F_1$ described above, frequency $F_1/2$ is 10.15625 GHz. From DC to 9.12625 GHz, the frequency response is one. From 9.15265-11.15625 GHz, the frequency response linearly changes from one to zero, passing through ½ at 10.15625 GHz. The resulting spectral components are shown in FIGS. 4A and 4B. FIG. 4A shows the filtered, mixed analog signal that includes a lower frequency portion of the spectrum 200, illustrated by 400, and a lower frequency portion of spectrum 302, illustrated by spectrum 402. Due to the digital mixing, spectrum 402 includes frequency components of a higher sub-band of spectrum 300, albeit reversed in frequency. Similarly, the spectral components 410 and 412 of FIG. 4B correspond to the lower frequency components of spectra 310 and 312 of FIG. 3A. The 180 degree phase relationship of spectrum 312 is preserved in spectrum 412.

Accordingly, through the harmonic mixing, two sub-bands of the digital input signal are converted to analog signals even though the span of the sub-bands would have exceeded a Nyquist bandwidth associated with the DACs. Each mixed signal, whether analog, digital, filtered, or the like, includes components of each sub-band of the digital input signal, such as a low frequency sub-band and a high frequency sub-band of the spectrum 300 shown in FIGS. 4A and 4B.

For example, the sub-bands of the digital input signal are frequency shifted to be within a bandwidth of a baseband sub-band. In some examples, each sub-band of the digital input signal is frequency shifted to be within the bandwidth of the single sub-band. However, depending on the number of sub-bands, and the harmonic signals, each sub-band may not be present in each mixed signal.

Figure 5A:
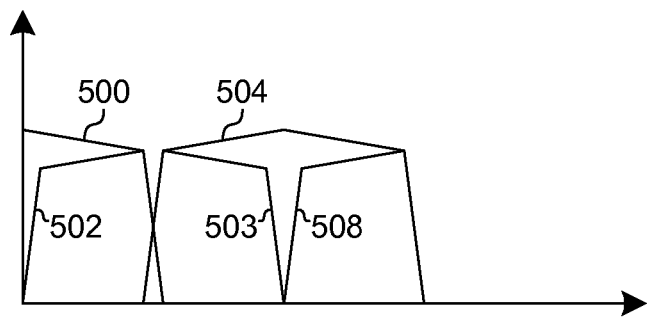
Figure 5B:
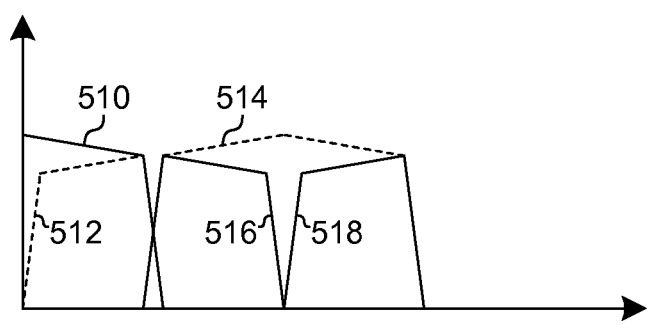

FIGS. 5A and 5B represent the spectra of the remixed signals that are input to the combiner. As described above, the analog, harmonic signal and the digital, harmonic signal can have substantially similar frequency and phase. Accordingly, the spectra of FIG. 4A are mixed with a DC component and a first-order analog harmonic signal.

Spectra 500 and 502 represent the spectra from mixing the spectra 400 and 402 of FIG. 4A with the DC component. Spectrum 504 represents the result of mixing the spectrum 400 with the first-order harmonic. Spectra 506 and 508 represent the mixing of spectrum 402 of FIG. 4A with the first-order harmonic.

Similarly, FIG. 5B represents the spectra of the remixed signal for the inverted harmonic signal. Spectra 510 and 512 represent the mixing of the DC component with the spectra of FIG. 4B. Spectrum 514 represents the mixing of the first-order harmonic of the inverted analog, harmonic signal with the spectrum 410 of FIG. 4B. In particular, as the first-order harmonic of the inverted, analog harmonic signal has a relative 180 degree phase shift, the resulting spectrum 514 also has a 180 degree phase shift, represented by the dashed line.

Spectrum 412 of FIG. 4B is also mixed with the first-order harmonic of the inverted, analog harmonic signal; however, the spectrum 412 already had a 180 degree induced phase shift. Thus, the additional 180 degree phase shift results in an effective 0 degree phase shift, represented by the solid line of spectra 516 and 518.

Figure 6:
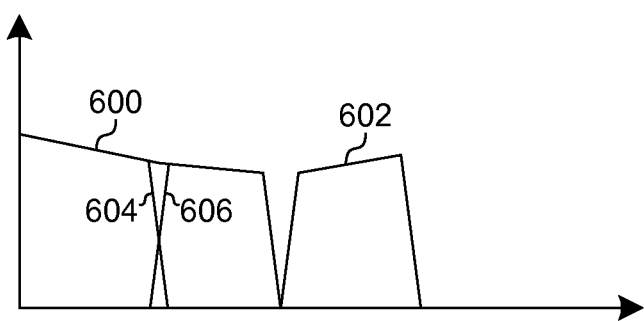

FIG. 6 shows a spectrum 600 of the reconstructed digital input signal that is output from the combiner shown in FIG. 1. Spectra 604 and 606 represent the component sub-bands forming the spectrum 600. Spectrum 602 represents an additional sideband from the mixing described with respect to FIGS. 5A and 5B. In this example, spectrum 602 is filtered out; however, in other examples sub-bands can extend beyond the first-order harmonic frequency $F_1$. In this case, because spectrum 602 is generated from a lower frequency sub-band it can be eliminated through destructive combination.

Due to the relative phasing of the components of the remixed signals, sub-bands in their original frequency range combine constructively, while sub-bands outside of their original frequency range are phased to combine destructively. Referring to FIGS. 5A, 5B, and 6, when combined, spectra 500 and 510 combine constructively, which results in spectrum 604. Spectra 502 and 512 combine destructively as the spectra are out of phase by 180 degrees. Thus, the spectrum that remains within the baseband sub-band is the original sub-band.

Similarly, for the sub-band from approximately $F_1/2$ to $F_1$, spectra 506 and 516 combine constructively into spectrum 606, while spectra 504 and 514 combine destructively. Spectra 508 and 518 combine constructively into spectrum 602; however, spectrum 602 can be filtered out as it is beyond the expected input frequency range, which in this example is about less than frequency $F_1$.

As illustrated by spectra 604 and 606, a transition occurs around frequency $F_1/2$ that is the result of the filtering described above in reference to FIGS. 4A and 4B. The slopes of spectrum 604 and spectrum 606 are complementary. Thus, when the frequency components of the spectrums 604 and 606 are combined, the resulting portion of the spectrum 600 substantially matches the original frequency spectrum.

Accordingly, by mixing the digital input signal with various harmonic signals, sub-bands of the digital input signal are passed through the lower bandwidth of the DACs.

Although the mixed signals include overlapping sub-bands, because of the phasing of the harmonic signals, the sub-bands combine constructively and destructively when combined as described above to create a substantially accurate analog reconstruction of the digital input signal.

In some examples, the analog and digital harmonic signals are frequency and phase aligned with each other. One way to align the frequency and phase of the analog and harmonic signals is to choose a mixing frequency that is a harmonic of a lower-speed clock that is present in the DAC channels in the analog domain, but is also correlated to the digital harmonic signals. In other examples, a separate DAC channel serves as a reference frequency that is multiplied with the mixing frequency of the analog harmonic mixers. In some of the examples described above, the analog harmonic mixers pass DC harmonic signals on all channels. Alternatively, the digital input signal can be split into bands, and each band is multiplied with the appropriate mixing harmonic signal. The digital bands are then recombined before being converted to analog signals. For each band, only one clock harmonic generates a mixing product within the low-pass filter bandwidth of the DAC channel. The only digital harmonic mixer that is required to handle a DC input is for the low input band, which is mixed with the zero-th clock harmonic (i.e., multiplied by 1 or passed straight through without actually requiring a mixer).

In another alternative, the analog mixers can pass DC harmonic signals on all channels by adapting a standard mixer topology to perform harmonic mixing that includes the DC components.

Figure 7A:
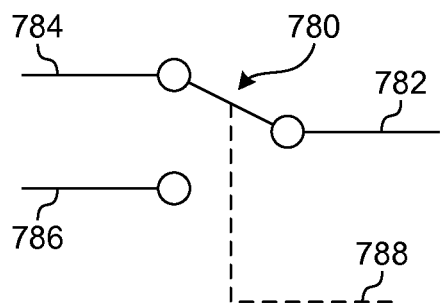
FIGS. 7A, 7B, 8, 9, and 10 are circuit diagrams of example harmonic mixers of the disclosed waveform generators.
Figure 7B:
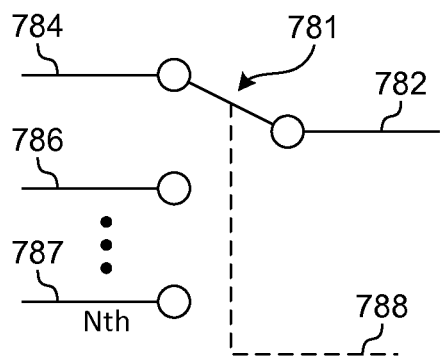

FIGS. 7A and 7B illustrate examples of a harmonic mixer, which can represent any one or more of the harmonic mixers discussed above. FIG. 7A illustrates a 2-way time-interleaving switch. FIG. 7B illustrates an N-way time-interleaving switch.

In these embodiments, switches 780 and/or 781 are configured to output a signal 782.

When using the 2-way switch 780, an input signal 784 or 786 is to output 782 in response to a control signal 788. When using the N-way switch 781, an input signal 784, 786, on through to the Nth input 787, is switched to output 782, in response to the control signal 788. For example, the switch 781 can be a three-throw switch, a four-throw switch, etc., up to an N-throw switch, which causes an input signal 784, 786, on through to the Nth input 787 to spend 1/Nth of its time at the output 782. As further paths and sub-bands are added, the harmonics of the harmonic signals can be appropriately phased. In some embodiments, the relative phase shifts of the harmonic signals can be spaced in phase by time shifts of one period divided by the number of sub-bands.

As the pulses get shorter compared to the overall clock cycle, the harmonic content gets richer. For instance, for a two-way or a three-way switch, the zero-order harmonic (DC) and the first-order harmonic are used. For a four-way or five-way switch, the zero-order harmonic, the first-order harmonic, and a second-order harmonic can be used. For a six-way or seven-way switch, the zero-order harmonic, the first-order harmonic, a second-order harmonic, and a third-order harmonic can be used. As N increases, the pulses get narrower, thereby generating the richer harmonic content. The control signal 788 can be a signal having a fundamental frequency of the first-order harmonic, or other suitable harmonic frequency, described above.

All bands of the input signals 784, 786, on through to the Nth input 787 go through the output path 782.

For example, referring to switch 780, the control signal 788 can be a square wave with a fundamental frequency of 20.3125 GHz. As a result of the switching, output 782 receives the input signal 784 or 786 during one half-cycle of the control signal and receives the other input signal during the opposite half-cycle. In effect, the output 782 is the input signal 784 or 786 multiplied by a square wave oscillating between zero and one at 20.1325 GHz, for example. Such a square wave can be represented by equation (4).

$$0.5 + \frac{2}{\pi}\sin(2\pi F_1 t) + \frac{2}{3\pi}\sin(6\pi F_1 t) + \ldots \quad (4)$$

Equation (4) is the Taylor series expansion of such a square wave. The DC and first two harmonics are listed. Here, $F_1$ is 20.1325 GHz. Although the magnitudes of the components are different, equations (1) and (4) include similar harmonics.

Input 786 is similar to input 784; however, the time period over which the input signal 784 or 786 is routed to the output 782 is inverted relative to input 784. The effect is again similar to multiplying the input signal 784 or 786 with a square wave defined by equation (5).

$$0.5 - \frac{2}{\pi}\sin(2\pi F_1 t) - \frac{2}{3\pi}\sin(6\pi F_1 t) + \ldots \quad (5)$$

Similar to equation (4), equation (5) is similar to the harmonic signal described in equation (2) above. Thus, the multiplication effect of the switching of the switch 780 is substantially similar to the mixing of a split signal with the harmonic signal described above. In addition, in this example, the switch acts as both the combiner and harmonic mixers. However, in other embodiments, the switch 780 could be a single pole single throw switch and act as a single harmonic mixer.

Although the relative magnitudes of the DC component and the first-order harmonic are different, such imbalance can be corrected through a compensation filter in the appropriate path. For example, the sub-band described above between frequency $F_{1/2}$ and frequency $F_1$ can have a different gain applied during recombination in the combiner than a baseband sub-band.

In addition, equations (4) and (5) above also list third-order harmonics. In some embodiments, the third-order harmonics may be desired. However, if not, the effect of such harmonics can be compensated with appropriate filtering. For example, the input signals can be filtered to remove frequency components above frequency $F_1$. Thus, such frequency components would not be present to mix with a frequency at $3*F_1$. Moreover, filtering before a DAC can remove any higher order frequency components that may otherwise affect the analog signal due to aliasing.

In the event of interleaving errors due to mismatch, hardware adjustments can be made for mixing clock amplitude and phase. The adjustments can then be calibrated to minimize interleave mismatch spurs. Alternatively, or in addition to the above approach, hardware mismatches can be characterized, and a linear, time-varying correction filter can be used to cancel the interleave spurs.

Further, in some cases, the switches might not always operate perfectly. For example, an errant switch might spend more time in one direction than the other, thereby causing a skewed duty cycle. The digital harmonic mixers can be configured to compensate for phase or amplitude errors that may be present in the analog harmonic signals by making subtle adjustments to the amplitude or phase of the analog harmonic signals.

Figure 8:
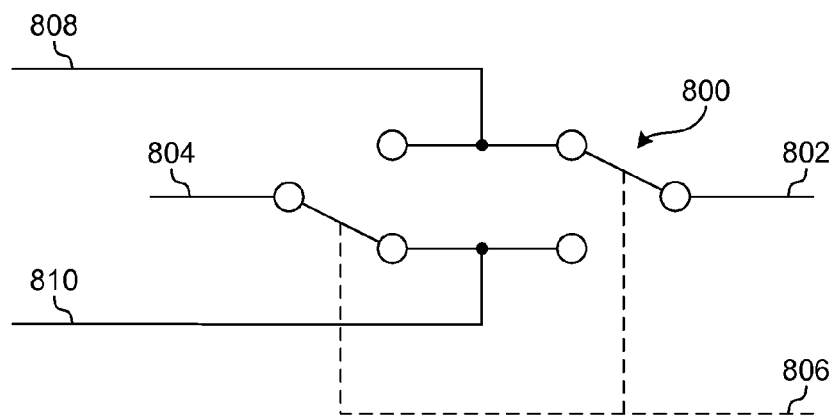

FIG. 8 is an example of another harmonic mixer. A switching circuit 800 is configured to switch two input signals 808 and 810 alternatively to outputs 802 and 804 in response to the control signal 806. The control signal 806 can again be a square wave or other similar signal to enable the switches of the switching circuit 800 to switch. During one half-cycle of the control signal 806, input signal 808 is switched to output 802 while input signal 810 is switched to output 804. During the other half-cycle, the input signal 808 is switched to output 804 while input signal 810 is switched to output 802.

In some embodiments, the input signal 810 can be an inverted and scaled version of the input signal 808. The result of such inputs and the switching described above is a rebalancing of the DC and other harmonics from the levels described above with respect to the switch 780 of FIG. 7A. For example, input signal 810 can be a fractional inverted version of the inputs signal 808. Instead of switching between 1 and 0 with the switch 880 of FIG. 7A, the effective output of outputs 802 and 804 can be switching between 1 and $(2-\pi)/(2+\pi)$, for example. Thus, the amplitude and DC level can be adjusted as desired to create the desired balance between the harmonics.

Figure 9:
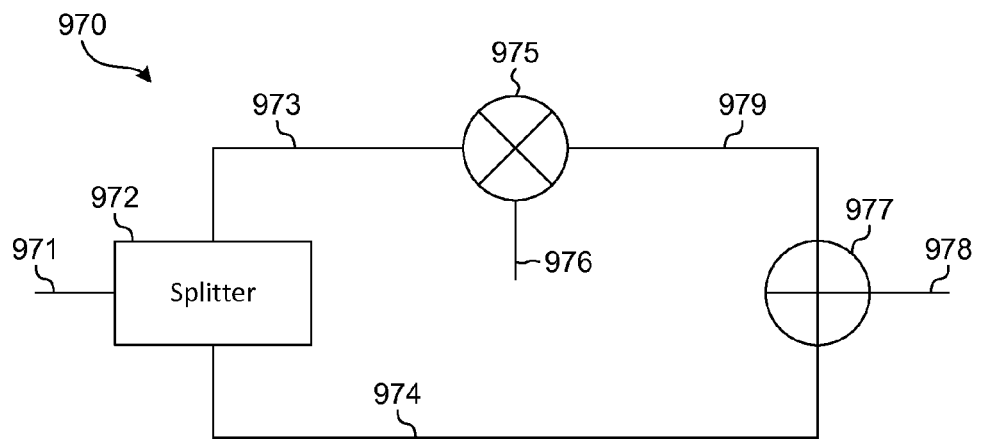

FIG. 9 illustrates an alternative example of a harmonic mixer. The harmonic mixer 970 includes a splitter 972, a mixer 975, and a combiner 977. The splitter 972 is configured to split an input signal 971 into signals 973 and 974. Signal 974 is input to the combiner 977. As signal 974 is not mixed with another signal, signal 974 acts as the DC component of a harmonic mixer described above.

Signal 973 is input to the mixer 975. A signal 976 is mixed with the signal 973. In some embodiments, signal 976 can be a single harmonic, such as the frequency $F_1$ described above. If additional harmonics are desired, additional mixers can be provided and the respective outputs combined in combiner 977.

In another embodiment, the signal 976 can include multiple harmonics. As long as the bandwidth of the ports of the mixer 975 accommodate the desired frequency ranges, a single mixer 975 can be used. However, since the DC component of the harmonic signals described above is passed to the combiner 977 by a different path, the ports of the mixer receiving signals 973 and 976 need not operate to DC. Accordingly, a wider variety of mixers may be used. Once the signals 979 and 974 are combined in the combiner 977, the output signal 978 can be substantially similar to a mixed signal described above.

In some embodiments, the splitter 972 can, but need not, split the input signal 971 symmetrically. For example, a side of the splitter that outputs signal 974 has a bandwidth that is at or above the filtering cutoff frequency described above. A side of the splitter 972 that outputs signal 973 has a frequency range centered on a harmonic of the signal 976 and a bandwidth of twice or greater of the filtering cutoff frequency described above. In other words, the frequency response of the splitter 972 need not be equal for each path and can be tailored as desired.

Figure 10:
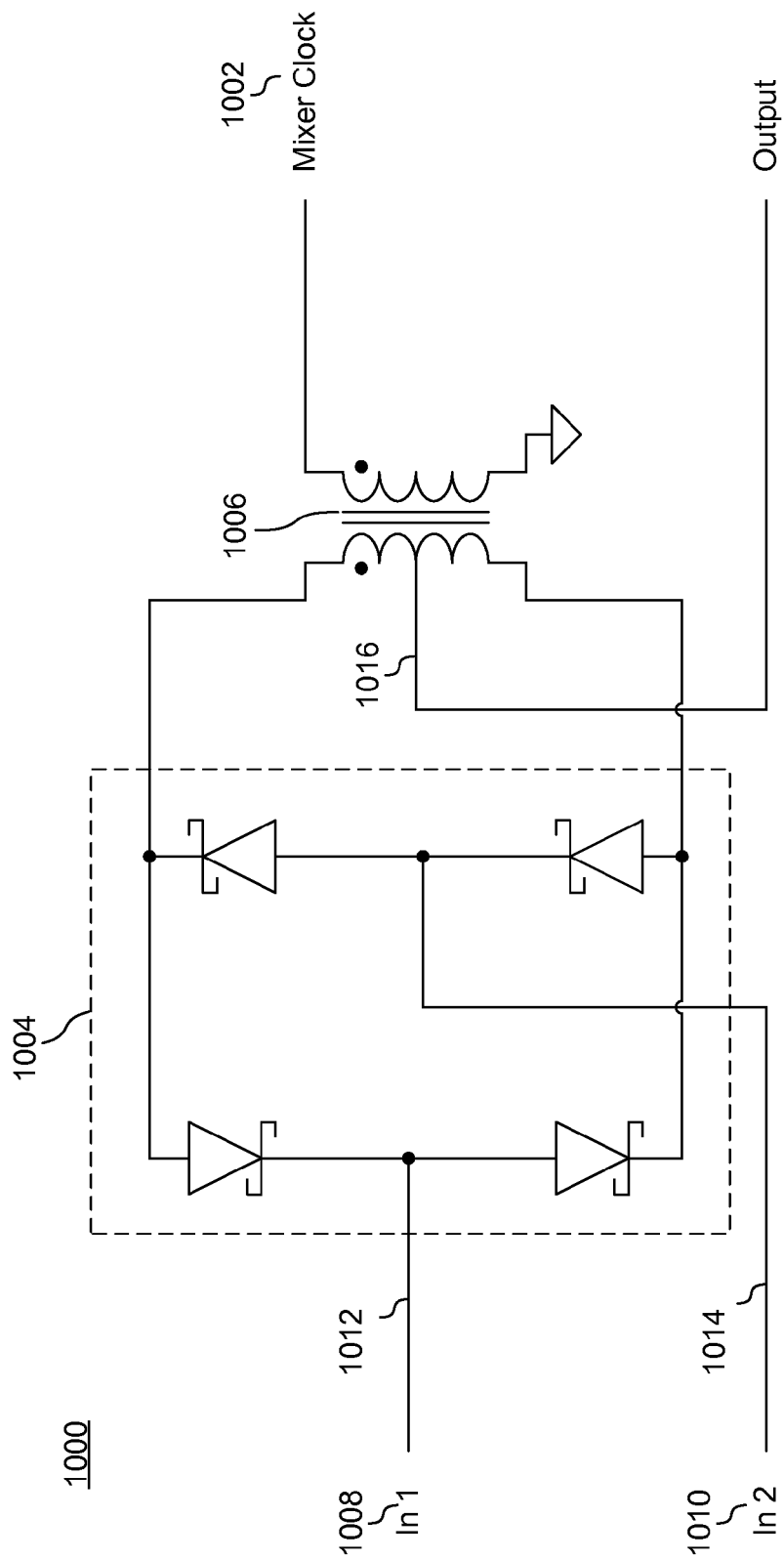

For example, FIG. 10 is a circuit diagram of an example mixer topology 1000 that performs harmonic mixing with DC components by adapting a diode-ring mixer to implement the analog harmonic mixers for a two-way interleaved system. In this example, a harmonic signal 1002, such as a mixer clock, can be input to a diode ring 1004 through transformer 1006. The input signals 1008, 1010 can be applied to inputs 1012 and 1014. Accordingly, depending on the harmonic signal, the input signals can be alternately switched to the output 1016, the center tap of the transformer 1006. For example, the harmonic signal causes the right diodes to turn on when the bottom of the transformer is positive and the top is negative, or the left diodes to turn on when the polarity of the transformer is reversed. In this manner, the two input signals 1008, 1010 are alternately routed to the output on opposite halves of the harmonic cycle. Note that in this example, the diode-ring mixer provides the combined function of two mixers and the combiner.

In some embodiments, two paths and two overlapping sub-bands are implemented. However, as mentioned above, any number of paths and sub-bands can be used. In such embodiments, the number of harmonics used can be equal to one plus one half of a number of sub-bands, rounded down, where DC is included as a zero-order harmonic. For example, for three sub-bands, only two harmonics can be used. Using the above frequency ranges as an example, the first-order harmonic can frequency shift frequencies higher than frequency $F_1$ to the baseband sub-band. The first-order harmonics of the harmonic signals can be phased with 120 degree relative phase shifts.

Accordingly, when a sub-band is in the proper frequency range during combination in the combiner 58, the sub-band spectra will have the same phase shift, such as a 0 degree relative phase shift. In contrast, the three components of a sub-band in the incorrect frequency range would offset in phase from one another by 120 degrees. The resulting spectra would destructively combine to eliminate the incorrect sub-band. As further paths and sub-bands are added, the harmonics of the harmonic signals can be appropriately phased. In some embodiments, the relative phase shifts of the harmonic signals can be spaced in phase by time shifts of one period divided by the number of sub-bands.

Moreover, although the digital filtering, mixing, and combining have been described as discrete operations, such operations can be combined, incorporated into other functions, or the like. In addition, as the above discussion assumed ideal components, additional compensation, can be introduced into such processing as appropriate to correct for non-ideal components.

Another embodiment includes computer readable code embodied on a computer readable medium that when executed, causes the computer to perform any of the above-described operations. As used here, a computer is any device that can execute code. Microprocessors, programmable logic devices, multiprocessor systems, digital signal processors, personal computers, or the like are all examples of such a computer. In some embodiments, the computer readable medium can be a tangible computer readable medium that is configured to store the computer readable code in a non-transitory manner.

It will be appreciated that variations of the above-disclosed systems and methods for generating waveforms and other features and functions, or alternatives thereof, may be desirably combined into many other different systems, methods, or applications. Also various presently unforeseen or unanticipated alternatives, modifications, variations, or improvements therein may be subsequently made by those skilled in the art.

What is claimed is:

1. A waveform generator, comprising:
    a splitter structured to receive a digital input signal having an input signal frequency bandwidth and structured to split the digital input signal into a plurality of split signals, each of the split signals having a split signal frequency bandwidth that is substantially similar to the input signal frequency bandwidth;
    a plurality of digital, harmonic mixers structured to digitally mix an associated one of the split signals with an associated digital harmonic signal to generate a plurality of digital mixed signals;
    a plurality of digital to analog converters, each of the plurality of digital to analog converters structured to convert an associated digital mixed signal of the plurality of digital mixed signals to an analog signal, each of the digital to analog converters having an effective sample rate that is different from a first order harmonic signal of at least one of the associated digital, harmonic mixers;
    a plurality of analog, harmonic mixers structured to mix an associated one of the analog signals with an analog harmonic signal to generate a plurality of mixed, analog signals; and
    a combiner structured to combine the plurality of mixed, analog signals into an output signal having an output signal bandwidth that is greater than a bandwidth of at least one of the plurality of digital to analog converters.

2. The waveform generator of claim 1, wherein the first-order harmonic signal of the at least one of the associated digital, harmonic mixers is not an integer multiple or sub-multiple of the effective sample rate of the at least one digital to analog converters.

3. The waveform generator of claim 1, wherein the first-order harmonic of the at least one harmonic signal associated with the digital, harmonic mixers is between the effective sample rate of the at least one of the digital to analog converters and one half the effective sample rate of the at least one of the digital to analog converters.

4. The waveform generator of claim 3, wherein the first order harmonic of the digital, harmonic mixer is substantially similar to the first order harmonic of the analog, harmonic mixer.

5. The waveform generator of claim 1, wherein the plurality of digital mixed signals includes at least two sub-bands of the digital, input signal within a bandwidth of a single-sub-band.

6. The waveform generator of claim 5, wherein the single sub-band is a baseband sub-band.

7. The waveform generator of claim 5, wherein each digital mixed signal includes each sub-band of the digital input signal within the bandwidth of the single sub-band.

8. The waveform generator of claim 1, further comprising a plurality of symmetric, digital filters that are structured to symmetrically filter the plurality of digital, mixed signals before the digital, mixed signals are converted to analog signals.

9. The waveform generator of claim 1, wherein the analog, harmonic mixers have a first order harmonic that is different from the effective sample rate of the digital to analog converters.

10. A method of generating a waveform, comprising:
    splitting a digital input signal having an input signal frequency bandwidth into a plurality of split signals, each of the split signals having a split signal frequency bandwidth that is substantially similar to the input signal frequency bandwidth;
    digitally mixing each of the split signals with an associated digital harmonic signal at an effective sample rate to generate a plurality of digital mixed signals;
    converting the plurality of digital mixed signals to a plurality of analog signals at an effective sample rate that is different from a first order harmonic signal of at least one of the associated digital, harmonic mixing;

mixing each of the analog signals with an associated analog harmonic signal to generate a plurality of mixed, analog signals; and combining the plurality of mixed, analog signals into an output signal having an output signal bandwidth that is greater than a bandwidth of at least one of the plurality of digital to analog converters.

11. The method of claim 4, wherein the first-order harmonic signal is not an integer multiple or sub-multiple of an effective conversion sample rate at which the plurality of digital, mixed signals are converted to the plurality of analog signals.

12. The method of claim 4, wherein the first-order harmonic signal is between an effective conversion sample rate at which the plurality of digital, mixed signals are converted to the plurality of analog signals and one half the effective conversion sample rate.

13. The method of claim 12, wherein the single sub-band is a baseband sub-band.

14. The method of claim 12, wherein each digital, mixed signal includes each sub-band of the digital input signal within the bandwidth of the single sub-band.

15. The method of claim 12, wherein the first order harmonic of the digital, harmonic signal is substantially similar to the first order harmonic of the analog, harmonic signal.

16. The method of claim 12, further comprising symmetrically filtering the digital mixed signals before the digital mixed signals are converted to analog signals.

17. The method of claim 4, wherein the plurality of digital, mixed signals includes at least two sub-bands of the digital, input signal within a bandwidth of a single sub-band.

* * * * *